United States Patent
Su et al.

(10) Patent No.: US 6,608,920 B1
(45) Date of Patent: Aug. 19, 2003

(54) TARGET ACQUISITION TECHNIQUE FOR CD MEASUREMENT MACHINE

(75) Inventors: Bo Su, San Jose, CA (US); Mircea Dusa, Campbell, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/183,077

(22) Filed: Oct. 29, 1998

(51) Int. Cl.[7] ................................................ G06K 2/00
(52) U.S. Cl. ........................ 382/144; 382/151; 382/181; 382/305; 356/237.4; 356/620
(58) Field of Search ................................. 382/144, 151, 382/181, 305, 147; 256/252.1, 492.2; 438/14, 780; 430/30, 302; 348/135, 130; 328/35; 356/237.4, 620

(56) References Cited

U.S. PATENT DOCUMENTS

| | | | | |
|---|---|---|---|---|
| 4,200,861 A | * | 4/1980 | Hubach et al. ............. | 382/216 |
| 4,441,205 A | * | 4/1984 | Berkin et al. ............... | 382/151 |
| 4,442,188 A | | 4/1984 | Chiang .......................... | 430/5 |
| 4,633,504 A | * | 12/1986 | Wihl ........................... | 382/144 |
| 4,965,842 A | * | 10/1990 | Crossley et al. ............. | 348/135 |
| 4,974,046 A | | 11/1990 | Vora ............................. | 357/34 |
| 5,063,168 A | | 11/1991 | Vora ............................. | 437/31 |
| 5,109,430 A | * | 4/1992 | Nishihara et al. ........... | 382/151 |
| 5,235,626 A | * | 8/1993 | Flamholz et al. ............ | 378/34 |
| 5,256,505 A | | 10/1993 | Chen et al. .................... | 430/5 |
| 5,274,575 A | * | 12/1993 | Abe ........................ | 250/491.1 |
| 5,362,585 A | | 11/1994 | Adams ......................... | 430/30 |
| 5,427,878 A | * | 6/1995 | Corliss ......................... | 430/30 |
| 5,568,563 A | * | 10/1996 | Tanaka et al. ............... | 382/144 |
| 5,707,765 A | | 1/1998 | Chen ............................. | 430/5 |
| 5,731,877 A | * | 3/1998 | Ausschnitt ................... | 356/620 |
| 5,801,954 A | * | 9/1998 | Le et al. ....................... | 382/144 |
| 5,815,594 A | * | 9/1998 | Tanaka ......................... | 382/151 |
| 5,851,848 A | * | 12/1998 | Balamurugan ............... | 438/33 |
| 5,926,690 A | * | 7/1999 | Toprac et al. ................ | 438/780 |
| 5,965,306 A | * | 10/1999 | Mansfield et al. ........... | 430/22 |
| 6,057,171 A | * | 5/2000 | Chou et al. ................... | 438/14 |
| 6,094,256 A | * | 7/2000 | Grodnensky et al. ......... | 355/77 |
| 6,175,645 B1 | * | 1/2001 | Elyasaf et al. ............. | 382/147 |

* cited by examiner

Primary Examiner—Bhavesh M. Mehta
Assistant Examiner—Sheela Chawan
(74) Attorney, Agent, or Firm—Sughrue Mion PLLC

(57) ABSTRACT

In a process for measuring the CD of a mask pattern transferred to a semiconductor wafer, in which a series of dies are sequentially inspected by first locating a target area on the die and then vectoring to a CD measurement area, a technique is used whereby the stored image of an alignment target is used for pattern recognition in the process of acquiring each subsequent die's target. The stored image is updated with each new die inspected, using an image of the most recently acquired target area. In this manner, the stored target image always closely approximates the next target to be acquired. Thus, according to the invention, difficulties in recognizing and centering on the target are minimized, and CD measurements of much higher reliability can be effected.

12 Claims, 3 Drawing Sheets

TARGET ACQUISITION TECHNIQUE FOR CD MEASUREMENT MACHINE

BACKGROUND OF THE INVENTION

1. Field of the Invention

The present invention is directed to a method and apparatus for use in the photolithographic arts, particularly the semiconductor fabrication arts, which ensures rapid and accurate acquisition, via a pattern recognition technique, of a target indicia photolithographically reproduced on a test wafer. Target acquisition is, generally speaking, a subset of the overall process of CD (critical dimension) measurement of circuitry patterns on semiconductor-based dies, although the invention may also find utility in other areas.

2. Description of the Related Art

In the fabrication of semiconductor devices, photolithographic masks are used to transfer circuitry patterns to silicon wafers in the creation of integrated circuits. In general, in the production of semiconductor circuit devices, a series of such masks are employed in a preset sequence. Each photolithographic mask includes an intricate pattern of CAD-generated geometric patterns corresponding to the circuit components to be integrated onto the wafer. Each mask in the series is used to transfer its corresponding pattern onto a photosensitive layer (photoresist) which has been previously deposited on the silicon wafer. The transfer of the mask pattern onto the photosensitive layer or photoresist is currently performed by an optical exposure tool, which directs light or radiation through the mask to the photoresist.

Fabrication of the photolithographic mask follows a set of predetermined design rules which are set by processing and design limitations. For example, these design rules define the space tolerance between devices or interconnecting lines, and the width of the lines themselves, to ensure that the devices or lines do not overlap or interact with one another in undesirable ways. The design rule limitation is referred to within the industry as the "CD" (critical dimension). The critical dimension of a circuit is defined as the smallest width of a line or the smallest space between two lines which is to be permitted in the fabrication of the chip. More often than not, the CD is determined by the resolution limit of the exposure equipment. Presently, the CD for most applications is on the order of a fraction of a micron. Because of the extremely small scale of the CD, the instrument of choice for measurement and inspection is a scanning electron microscope (SEM).

When new masks are produced, or after any change in the fabrication recipe, it is customary to form a so-called focus exposure matrix (FEM) on a test wafer in order to obtain the best exposure/focus combination for the mask, e.g., the combination of focus and exposure which results in the best resolution on the wafer, in keeping with the required CD. This is typically done by, for example, sequentially exposing a series of areas of the wafer with the pattern of the mask, while exposure and focus values are incrementally changed from one exposure location to the next. After exposure of the wafer in this fashion, one can examine the individual exposure sites, for example, to check the CD, and obtain a plot of exposure v. focus or focus v. CD and determine the area of best performance from the resulting curves. Specifically, a test wafer is exposed in a stepper while the focus is varied along one axis and the exposure is varied along the other. Thus, a matrix of images is obtained on the exposed wafer, wherein each exposure site or die has a different focus-exposure setting. Selected CDs (at various locations) in each die are measured to select the best exposure-focus setting for the particular mask.

The general procedure for determining the CD in a test wafer is as follows. First, an alignment target (which is not part of the circuitry) is included on the mask, typically at an area which will not include circuit patterns. During exposure, an image of the alignment target is transferred onto each of the dies. When the test wafer is developed and loaded into the CD measurement machine (typically a CD SEM) the operator first causes the system to acquire the alignment target of the central or reference die of the wafer. The image of this alignment target is stored in memory for reference. The operator then acquires an appropriate area for CD measurement, and designates that area to the CD machine. The machine automatically calculates a vector from the center of the alignment target to the center of the designated area. This procedure is repeated for each area which the operator wishes to measure.

The foregoing procedure can be performed in what might be designated as a "teaching mode" of the CD SEM. Once all of the data has been input and the vectors calculated, the CD system may then be enabled for automated CD measurement as described below.

When the developed wafer is properly loaded into the CD machine, the machine moves to the first die to be inspected and searches for the alignment target using a pattern recognition (PR) algorithm, using the aforementioned stored alignment target as a reference. When a high PR score is achieved, it is considered that the alignment target has been acquired. Using the stored vector, the CD machine then moves to the designated CD measurement site and acquires an image for CD measurement, which is then performed. Following this procedure, which may be duplicated for other locations on the die, the CD machine then goes to the next die and again using the PR algorithm searches for the alignment target using the stored target as a reference. Once a high PR score is achieved, the CD machine goes to the CD measurement site using the stored vector. This process is repeated until all of the designated dies have been measured.

At least two problems exist with the foregoing technique. In particular, since the exposure-focus settings are by definition different for each die, the alignment target on each die appears somewhat different. Thus, it is difficult to consistently achieve a high PR score when comparing a specific target on a specific die to the stored target. In general, the correlation between the stored target and the target on any particular die will be a function of the spatial or exposure-sequence distance from the die containing the reference target to the die currently under measurement. In other words, lower PR scores would normally be expected at greater distances from the reference die. Accordingly, instances may occur where the CD SEM is unable to acquire the target, particularly at distant dies. Moreover, even if the target is acquired, since the target may be misshapen as compared to the stored target, the CD machine will not always align, i.e., center on, the same point of the alignment target. In consequence, when the CD machine moves to the measurement site using the stored vector, it will not always arrive at the correct measurement location on each die. Thus, the CD of different dies would actually be measured at locations different from that designated by the operator, possibly rendering useless the entire measurement procedure.

SUMMARY OF THE INVENTION

In order to solve the aforementioned problems occurring in the prior art, the present invention employs a method whereby the stored image of the alignment target is continuously updated, in the manner such that the stored target image always closely approximates the next target to be acquired. Thus, according to the invention, difficulties in recognizing and centering on the target are minimized, and CD measurements of much higher reliability can be effected.

According to another feature of the invention, the CAD design of the target is fed to a virtual stepper software which simulates the changes the target would undergo under the different focus-exposure conditions during the FEM construction, and outputs a series of simulated target images corresponding to the FEM. These images are used in three manners. First, each image is used as a check to verify the accuracy of the acquisition of each target. Second, each image is used as a back-up in case the comparison to the preceding target fails. Third, the simulated images are used to train the PR algorithm to anticipate the changes in the target's appearance as the system moves from die to die.

In a further implementation of the invention, a "golden target" image is acquired and stored. Then, each time a target is acquired using the FEM, a correlation score is obtained for the correlation between the acquired target and the golden target. The collection of correlation scores can be plotted together with the FEM plot, and/or is stored as a look-up table. Thereafter, during the process of CD measurement for line monitoring, if the CD shows an undesired variation, the correlation score look-up table can be consulted to determine whether the cause for the deviation is focus or exposure drift.

The above and other features and advantages will be further described below with reference to preferred embodiments thereof.

DETAILED DESCRIPTION OF THE PREFERRED EMBODIMENTS

Figure 1:
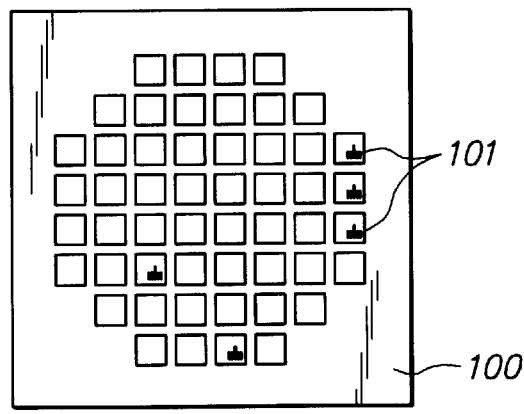
FIG. 1 illustrates a portion of a typical photolithographic mask, common to both the prior art and the invention.

FIG. 1 illustrates a portion of a typical photolithographic mask 100, illustrating a number of circuit patterns 101, shown schematically. In the illustrated case, several circuit patterns are shown; however, it is also customary to have only a few circuit patterns, e.g., 2 or 4, in which case the mask can be used in a "step and scan" method of exposing the wafers.

Figure 2:
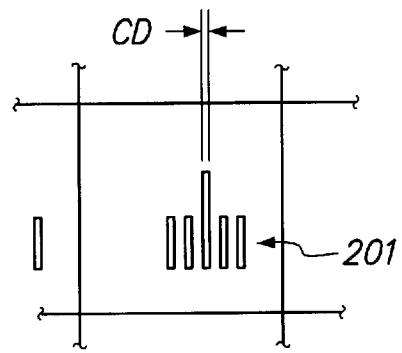
FIG. 2 is an enlargement of a portion of FIG. 1, illustrating one example of an alignment target.

As defined previously, the "critical dimension" CD is the width of a line and/or the distance between adjacent lines of such a pattern, as transferred to the wafer surface. Each circuit pattern 101 of the illustrated mask includes a target, shown in more detail in the enlarged view of FIG. 2. As shown, the target is a series of lines 201 which may run in various directions and may represent a unique easily-recognizable shape.

Figure 3:
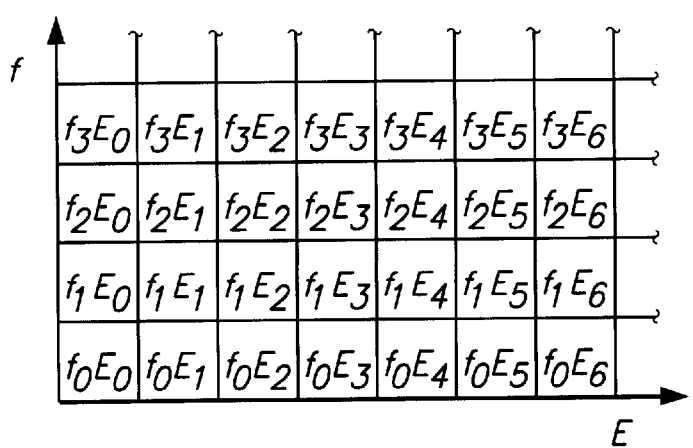
FIG. 3 illustrates a matrix of a focus-exposure matrix.
Figure 4:
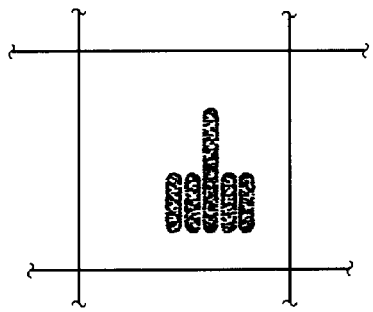
FIG. 4 illustrates a "degraded" acquisition target which is spatially and/or sequentially distant from the target shown in FIG. 2.

FIG. 3 illustrates a portion of a focus-exposure matrix. The matrix 301 is formed by patterning the wafer surface using light or other radiation passing through the mask. A single wafer may include hundreds of dies, each one of which corresponds to one of the exposure areas shown in FIG. 3. For convenience, only a small number of the dies are illustrated. Each of the dies of the matrix has an incrementally different exposure E and/or was formed with an incrementally different focus f than any of the surrounding dies, as referenced by nomenclature fnEm in the drawings. As mentioned previously, with respect to the overall matrix, the focus may be varied along one axis while the exposure is varied along the other axis in the formation of the matrix.

Figure 5:
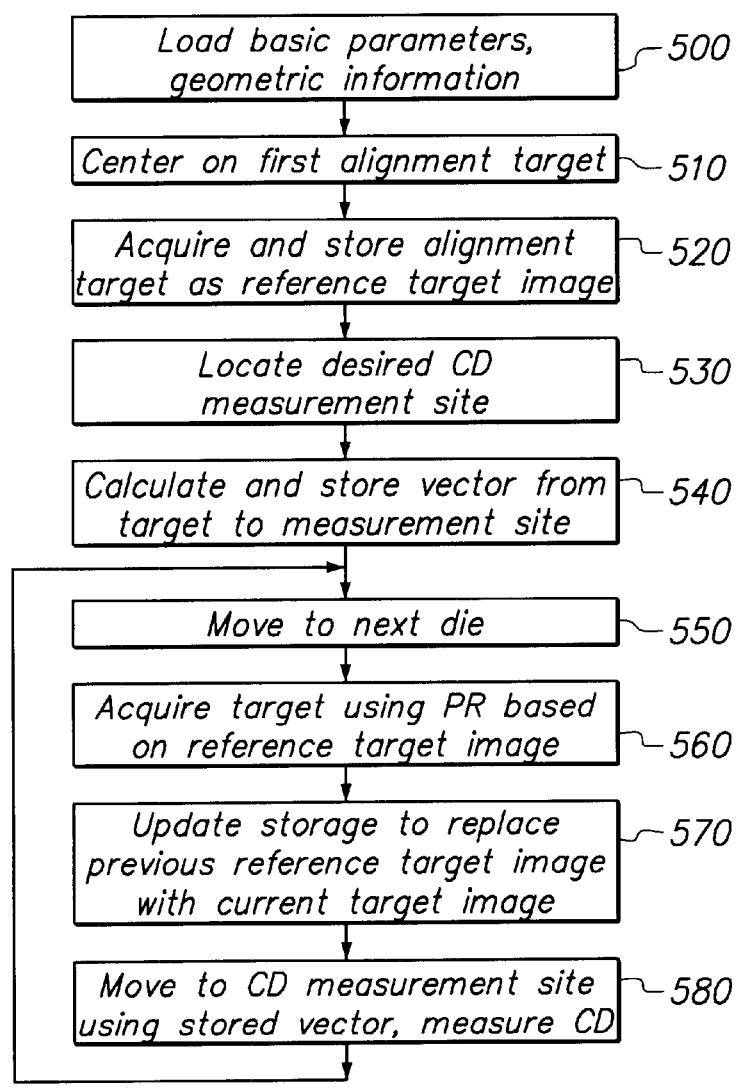
FIG. 5 is a flow chart illustrating the major steps of the invention.

FIG. 5 is a flow chart illustrating the major steps of the invention, as will be detailed below. According to the invention, the die inspection sequence is programmed into the CD SEM machine somewhat similarly to that described with regard to the related art, above. In this process, the CD SEM machine may be given basic geometric information about the wafer, such as the general layout of the dies, the die-to-die distance (e.g., center-to-center) and any other information necessary to enable the CD machine to move generally from one die to the next in an automated fashion (Step 500). For reasons which will become apparent later, the ordering of the inspection sequence is preferably in the same order as the die exposures, i.e., in the same increasing order as the focus-exposure settings.

The CD machine is first centered by the operator on the alignment target of the first die to be inspected (Step 510). The invention is preferentially employed using one of the first-exposed dies as the beginning location. The alignment target of the first die to be inspected is thus acquired and the image of the alignment target is stored as the reference for at least one subsequent inspection step (Step 520). Once this process is effected, the operator moves the CD machine to a desired site and designates this site for CD measurement (Step 530). The vector from the target location to the CD measurement site is calculated and stored (Step 540). A CD measurement is performed at this site and stored for future reference.

Figure 6:
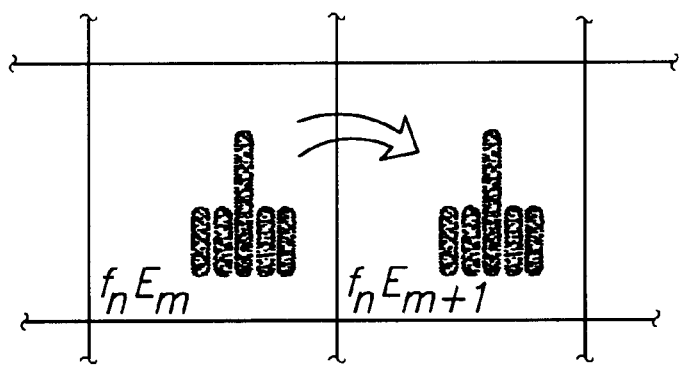
FIG. 6 illustrates the comparison process between "adjacent" targets.

Following this and any subsequent measurements on the first die, the CD machine is then placed in the automatic operation mode. In this mode, the CD machine is automatically moved to the second die in the inspection sequence and pattern recognition is performed to acquire the alignment target of the second die (Steps 550 and 560; see also FIG. 6). Since the second die has focus-exposure settings which by design are only slightly different than those of the first die, a very high PR score is easily achieved. Moreover, since the PR score is a high value, the accuracy of the location of the origin of the vector, and thus the positioning of the machine over the CD measurement site, is very high.

Before moving to the CD measurement site of the second die, or in any event before moving to the third die, the image of the target on the second die is memorized, in replacement of the image previously used as the reference for PR scoring (Step 570). The previously employed image (that of the target area of the first die) may remain stored in the original location, be moved elsewhere, or discarded. After taking the CD measurement or measurements for the second die (Step 580), the machine moves on to the third die in the sequence. Again, since the target image used as the reference is that of the immediately previously inspected die, in which the exposure-focus values differ only slightly, acquisition of the target at the third die is quickly and accurately obtained, with a resulting high PR score. Again, as the centering of the CD above the target area is performed almost without error, the actual CD measurement site is found via the stored vector with an extremely high degree of reliability.

The process of updating the target image using the target of each new die in sequence is repeated with each die being examined, such that the previous die's alignment target image is used as the reference value for pattern recognition.

Figure 7:
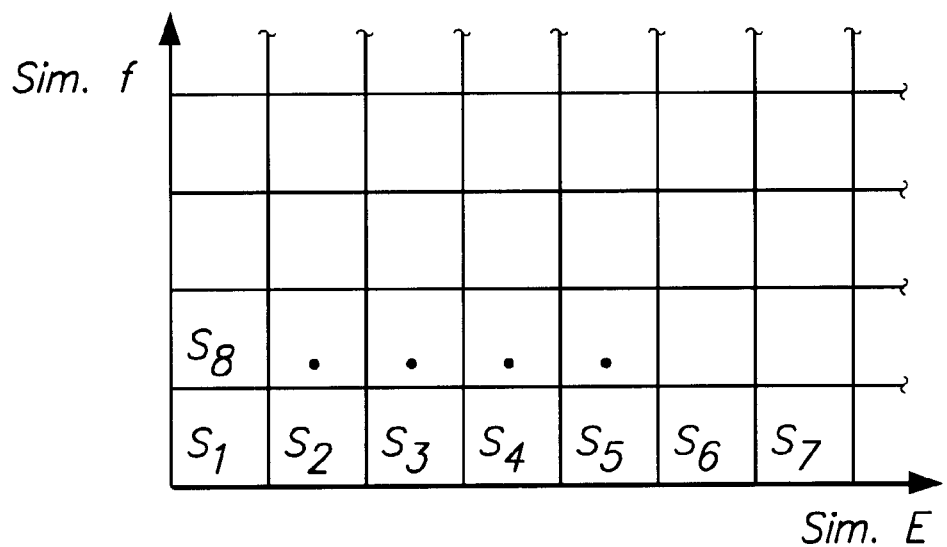
FIG. 7 illustrates a simulated focus-exposure matrix.

A second advantageous feature of the present invention will now be described in details. Specifically, this feature takes advantage of stepper simulation software to augment the capabilities and usefulness of the CD-SEM. As is known in the industry, stepper simulation software can be used to investigate how a particular CAD design feature will be transferred onto the wafer during exposure. Such software includes, as two of its variable parameters, focus and exposure settings. An example of such software is the Virtual Stepper™ available from Numerical Technologies of Santa Clara, Calif., According to an advantageous feature of the invention, the CAD design of the target is fed into the stepper simulation software. Then, the focus and exposure settings of the software are varied in the same manner they will be varied during the FEM procedure. Upon each setting change, a simulated target image is obtained and stored. Thus, a simulated FEM is generated, as depicted in FIG. 7. The present invention contemplates at least three advantageous uses of this simulated FEM, as will be explained below.

The first use of the simulated FEM is as a verification of the accuracy of the target acquisition. For example, when the SEM moves to the second die, it searches for the image of the target of the second die using the image of the first die, as explained above. Then, to verify the accuracy of the target acquisition, the image of the target of the second die is also compared to the simulated target image of the second die (S2 in FIG. 7). Thus, each target is first compared to the image of the target of the previous die, and then to a simulated target image of the same die.

The second contemplated use of the simulated FEM is for backup. That is, if the PR fails and the target cannot be aligned by comparison to the target of the previous die, the PR algorithm can be applied to the simulated target image of the present die. That is, a threshold for PR score can be set that, if it is not achieved by comparison to the image of the target from the previous die, the PR algorithm will attempt to obtain a better score using the simulated target image of the present die. Thus, for example, if an $f_0E_5$ fails to obtain high PR score by comparison to $f_0E_4$, then a better score can be attempted by comparing $f_0E_5$ to $S_5$.

The third contemplated use of the simulated FEM is for PR algorithm training. That is, since the virtual stepper algorithm simulates the "deformation" effects of the various focus-exposure settings on the target image, the resulting image can be used to train the PR algorithm to look for the "deformed" target. Thus, the PR algorithm can search for the target using the image of the target of the previous die, the simulated image of the present die, or some average/ weighted average of the two.

For example, an image or a CAD design of an un-deformed target can be fed to the virtual stepper. The virtual stepper can simulate the deformation of the target for each exposure/focus setting. Depending on the photolithography process employed, it may be difficult to obtain high PR score using the target image of the previous die. Similarly, the simulation may not be acurate and at time may exaggerate or underestimate the effects of the changes in the focus/exposure settings. Therefore, it may be beneficial to use the simulation to modify the image of the target from previous die to approximate the appearance of the target under search. A simple method of doing so would be to take an average of the image of the target from the previous die and the simulated image. A natural extension of that method would be to take a weighted average, in which a heavier weight is assigned to the more accurate image (e.g., 60% actual image 40% simulated image).

Although the invention has been described and shown in terms of preferred embodiments thereof, it will be understood by those skilled in the art that changes in form and detail may be made therein without departing from the spirit and scope of the invention as defined in the appended claims.

What is claimed is:

1. A method of improving the reliability of a critical dimension (CD) measurement in a photolithographic process, comprising the steps of:
   a. storing as a reference an image of a selected target formed on a photolithographically exposed semiconductor wafer, and storing a vector value between a point of said selected target and a CD measurement site;
   b. performing a pattern recognition process using said reference image, to acquire a next target formed on another region of said wafer, and using said vector value to acquire a CD measurement site within said another region;
   c. updating said reference image by replacing said stored image with an image of said next target; and
   d. repeating step (b) using the updated reference image.

2. A method as claimed in claim 1, wherein the selection of said selected target is based on the order in which all targets were photolithographically transferred onto said wafer.

3. A method as claimed in claim 2, wherein said selected target is the first photolithographically transferred target.

4. A method as claimed in claim 1, further comprising the steps of:
   obtaining a simulated image of said next target using a simulator; and,
   using said simulated image to confirm correct acquisition of said next target.

5. A method as claimed in claim 1, further comprising the steps of:
   obtaining a simulated image of said next target using a simulator; and,
   using said simulated image to train the pattern recognition process in searching for said next target.

6. A method as claimed in claim 1, further comprising the steps of:
   obtaining a simulated image of said next target using a simulator; and,
   using said simulated image as a backup in case said pattern recognition process fails to acquire said next target.

7. A method of improving the reliability of an optical measurement, comprising the steps of:
   storing as a reference an image of a first target area formed on a device, and a vector value between a point of said first target area and a measurement site;
   performing a pattern recognition process using said reference image, to acquire a second target area formed on a second region of said device, and using said vector value to acquire a measurement site within said second region;
   updating said reference image by replacing said stored image with an image of said second target area, performing a pattern recognition process using said update reference image, to acquire a third target area formed on a third region of said device, and using said vector value to acquire a measurement site within said third region.

8. A method of improving the reliability of site location, comprising the steps of:

a. storing as a reference an image of a selected target;

b. performing a pattern recognition process using said reference image, to acquire a next target;

c. updating said reference image by replacing said stored image with an image of said next target; and repeating step b using said updated reference image, obtaining a simulated image of said next target using a simulator operating on an original target; and, using said simulated image to confirm correct acquisition of next target.

9. The method of claim 8, wherein said original target is obtain from a CAD design.

10. The method of claim 8, wherein said original target is an image of said selected target.

11. The method as claimed in claim 8, further comprising the steps of:

obtaining a simulated image of said next target using a simulator; and, using said simulated image to train the pattern recognition process in searching for said next target.

12. A method as claimed in claim 8, further comprising the steps of:

obtaining a simulated image of said next target using a simulator; and, using said simulated image as a backup in case said pattern recognition process fails to acquire said next target.

* * * * *